(12) United States Patent
Nakagawa et al.

(10) Patent No.: US 6,762,120 B2
(45) Date of Patent: Jul. 13, 2004

(54) SEMICONDUCTOR DEVICE AND METHOD FOR FABRICATING THE SAME

(75) Inventors: Hideo Nakagawa, Shiga (JP); Eiji Tamaoka, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 116 days.

(21) Appl. No.: 10/251,975

(22) Filed: Sep. 23, 2002

(65) Prior Publication Data

US 2003/0022481 A1 Jan. 30, 2003

Related U.S. Application Data

(62) Division of application No. 09/987,340, filed on Nov. 14, 2001, now abandoned.

(30) Foreign Application Priority Data

Nov. 17, 2000 (JP) .......................................... 2000-350992

(51) Int. Cl.[7] .......................................... H01L 21/4763
(52) U.S. Cl. ........................ 438/619; 438/622; 438/624
(58) Field of Search ................................ 438/618, 619, 438/622, 623, 624

(56) References Cited

U.S. PATENT DOCUMENTS

| | | | |
|---|---|---|---|
| 5,668,398 A | | 9/1997 | Havemann et al. |
| 6,054,381 A | * | 4/2000 | Okada ........................ 438/624 |
| 6,130,151 A | | 10/2000 | Lin et al. |
| 6,184,121 B1 | | 2/2001 | Buchwalter et al. |
| 6,242,336 B1 | * | 6/2001 | Ueda et al. .................. 438/619 |
| 6,303,487 B1 | * | 10/2001 | Kagamihara ................ 438/619 |
| 2002/0014697 A1 | * | 2/2002 | Tamaoka et al. ............ 257/758 |
| 2002/0050651 A1 | * | 5/2002 | Nakagawa et al. ......... 257/774 |

OTHER PUBLICATIONS

Shieh, B.P., et al. "Integration and Reliability for Low Capacitance Air–Gap Interconnect Structures", Jun. 1998, IEEE, Proceedings International Interconnect Technology Conference (IITC), pp. 125–127.

* cited by examiner

Primary Examiner—T. N. Quach
(74) Attorney, Agent, or Firm—Nixon Peabody LLP; Donald R. Studebaker

(57) ABSTRACT

A plurality of metal interconnects are formed on a lower interlayer insulating film provided on a semiconductor substrate. An upper interlayer insulating film is formed so as to cover the plural metal interconnects. The upper interlayer insulating film has an air gap between the plural metal interconnects, and a top portion of the air gap is positioned at a level higher than the plural metal interconnects.

10 Claims, 18 Drawing Sheets

SEMICONDUCTOR DEVICE AND METHOD FOR FABRICATING THE SAME

This application is a divisional of U.S. application Ser. No. 09/987,340, filed Nov. 14, 2001, abandoned.

BACKGROUND OF THE INVENTION

The present invention relates to a semiconductor device including metal interconnects having an air gap and a method for fabricating the same.

A semiconductor device including metal interconnects having an air gap and a method for fabricating the same according to a first conventional example will now be described with reference to FIGS. 11A through 11C, 12A through 12C, 13A through 13C and 14A through 14C.

First, as shown in FIG. 11A, a lower interlayer insulating film 11 of an insulating material is formed on a semiconductor substrate 10 by chemical vapor deposition (CVD) or spin coating. Thereafter, although not shown in the drawing, a plug connected to the semiconductor substrate 10 or an interconnect formed on the semiconductor substrate 10 is formed in the lower interlayer insulating film 11.

Next, a first barrier metal layer 12, a first metal film 13 and a second barrier metal layer 14 are successively deposited on the lower interlayer insulating film 11. The first barrier metal layer 12 and the second barrier metal layer 14 are deposited by sputtering, and the first metal film 13 is formed by the sputtering, CVD or plating. Thereafter, an insulating film 15 is formed on the second barrier metal layer 14 by the CVD or spin coating.

Then, as shown in FIG. 11B, after forming a first resist pattern 16 on the insulating film 15 by lithography, the insulating film 15 is dry etched by using the first resist pattern 16 as a mask. Thus, plug openings 17 are formed in the insulating film 15 as shown in FIG. 11C.

Next, as shown in FIG. 12A, a second metal film 18 is deposited on the insulating film 15 so as to fill the plug openings 17 by the sputtering, CVD or plating.

Then, as shown in FIG. 12B, an unnecessary portion of the second metal film 18 present on the insulating film 15 is removed by chemical mechanical polishing (CMP), thereby forming contact plugs 19 from the second metal film 18. Thereafter, as shown in FIG. 12C, the insulating film 15 is dry etched so as to reduce the thickness thereof. Thus, upper portions of the contact plugs 19 protrude from the insulating film 15.

Subsequently, as shown in FIG. 13A, a second resist pattern 20 is formed on the insulating film 15 by the lithography. Then, as shown in FIG. 13B, the insulating film 15 is dry etched by using the second resist pattern 20 as a mask, thereby forming a patterned insulating film 15A in the pattern of interconnects.

Next, as shown in FIG. 13C, the second barrier metal layer 14, the first metal film 13 and the first barrier metal layer 12 are dry etched by using the second resist pattern 20, the patterned insulating film 15A and the contact plugs 19 as a mask, thereby forming metal interconnects 21 composed of a patterned second barrier metal layer 14A, a patterned first metal film 13A and a patterned first barrier metal layer 12A. In this manner, a remaining resist 22 in the shape of ridges with facets inclined at approximately 45 degrees is formed on the patterned insulating film 15A and facets are also formed in top portions of the patterned insulating film 15A.

In the first conventional example, the metal interconnects 21 are formed by dry etching the second barrier metal layer 14, the first metal film 13 and the first barrier metal layer 12 with the second resist pattern 20, the patterned insulating film 15A and the contact plugs 19 used as the mask. Instead, the metal interconnects 21 may be formed by dry etching the second barrier metal layer 14, the first metal film 13 and the first barrier metal layer 12 with the patterned insulating film 15A and the contact plugs 19 used as the mask after removing the second resist pattern 20 by ashing. In this case, the patterned insulating film 15A is sputtered during the dry etching for forming the metal interconnects 21, and hence, facets are also formed in the top portions of the patterned insulating film 15A.

Next, as shown in FIG. 14A, portions of the lower interlayer insulating film 11 between the metal interconnects 21 are trenched by the dry etching. Thus, the remaining resist 22 is removed but is transferred to the patterned insulating film 15A, resulting in enlarging the facets of the patterned insulating film 15A.

Then, as shown in FIG. 14B, an upper interlayer insulating film 23 is formed over the contact plugs 19, the metal interconnects 21 and the lower interlayer insulating film 11 by the CVD and air gaps 24 are formed in the upper interlayer insulating film 23 between the metal interconnects 21.

Subsequently, as shown in FIG. 14C, the upper interlayer insulating film 23 is planarized by the CMP. Thus, the interconnects having the air gaps are completed. Thereafter, the aforementioned sequence is repeated, so as to fabricate a semiconductor device having a multi-layer interconnect structure.

Since the upper interlayer insulating film 23 is formed with the facets formed in the top portions of the patterned insulating film 15A in the first conventional example, the upper interlayer insulating film 23 tends to enter the portions between the metal interconnects 21. Therefore, the top portion of the air gap 24 (a portion with a triangular cross-section) is positioned at substantially the same level as the metal interconnect 21.

A semiconductor device including metal interconnects having an air gap and a method for fabricating the same according to a second conventional example will now be described with reference to FIGS. 15A through 15C, 16A through 16C, 17A through 17C, 18A and 18B.

First, as shown in FIG. 15A, a lower interlayer insulating film 31 of an insulating material is formed on a semiconductor substrate 30 by the CVD or spin coating. Thereafter, although not own in the drawing, a plug connected to the semiconductor substrate 30 or an interconnect formed on the semiconductor substrate 30 is formed in the lower interlayer insulating film 31.

Next, a first barrier metal layer 32, a first metal film 33 and a second barrier metal layer 34 are successively deposited on the lower interlayer insulating film 31. The first barrier metal layer 32 and the second barrier metal layer 34 are deposited by the sputtering, and the first metal film 33 is formed by the sputtering, CVD or plating. Thereafter, an insulating film 35 is formed on the second barrier metal layer 34 by the CVD or spin coating.

Then, after forming a first resist pattern 36 on the insulating film 35 by the lithography as shown in FIG. 15B, the insulating film 35 is dry etched by using the first resist pattern 36 as a mask so as to form a patterned insulating film 35A in the pattern of interconnects as shown in FIG. 15C. Thereafter, the first resist pattern 36 is removed by the ashing.

Next, as shown in FIG. 16A, the second barrier metal layer 34, the first metal film 33 and the first barrier metal layer 32 are dry etched by using the patterned insulating film 35A as a mask, thereby forming metal interconnects 37 composed of a patterned second barrier metal layer 34A, a patterned first metal film 33A and a patterned first barrier metal layer 32A. Thus, the patterned insulating film 35A is sputtered during the dry etching for forming the metal interconnects 37, and hence, facets are formed in the top portions of the patterned insulating film 35A.

Then, as shown in FIG. 16B, portions of the lower interlayer insulating film 31 between the metal interconnects 37 are trenched by the dry etching. Thus, the patterned insulating film 35A is reduced in its thickness with the facets formed in the top portions thereof.

Subsequently, as shown in FIG. 16C, an upper interlayer insulating film 38 is formed over the metal interconnects 37 and the lower interlayer insulating film 31 by the CVD and air gaps 39 are formed in the upper interlayer insulating film 38 between the metal interconnects 37.

Next, after planarizing the upper interlayer insulating film 38 by the CMP as shown in FIG. 17A, a second resist pattern 40 is formed on the upper interlayer insulating film 38 as shown in FIG. 17B.

Then, as shown in FIG. 17C, the upper interlayer insulating film 38 is dry etched by using the second resist pattern 40 as a mask, thereby forming plug openings 41 in the upper interlayer insulating film 38. Thereafter, the second resist pattern 40 is removed by the ashing.

Subsequently, as shown in FIG. 18A, a second metal film 42 is deposited on the upper interlayer insulating film 38 by the sputtering, CVD or plating so as to fill the plug openings 41.

Next, as shown in FIG. 18B, an unnecessary portion of the second metal film 42 present on the upper interlayer insulating film 38 is removed by the CMP, so as to form contact plugs 43 from the second metal film 42. Thus, the interconnects having the air gaps are completed. Thereafter, the aforementioned sequence is repeated so as to fabricate a semiconductor device having a multi-layer interconnect structure.

Since the upper interlayer insulating film 38 is formed with the facets formed in the top portions of the patterned insulating film 35A in the second conventional example, the upper interlayer insulating film 38 tends to enter the portions between the metal interconnects 37. Therefore, the top portion of the air gap 39 (a portion with a triangular cross-section) is positioned at substantially the same level as the metal interconnect 37.

If a potential difference is caused between the adjacent metal interconnects 21 or 37, an electric field is collected at the upper and lower ends of each metal interconnect 21 or 37. This results in a problem that the capacitance between the interconnects is increased.

Therefore, in the first or second conventional example, the portions of the lower interlayer insulating film 11 or 31 between the metal interconnects 21 or 37 are trenched before forming the upper interlayer insulating film 23 or 38. Thus, the lower ends of the air gaps 24 or 39 are positioned to be lower than the lower ends of the metal interconnects 21 or 37, so as to reduce the capacitance between the interconnects.

However, the top portions of the air gaps 24 are positioned at substantially the same level as the metal interconnects 21 as shown in FIGS. 14B and 14C in the first conventional example and the top portions of the air gaps 39 are positioned at substantially the same level as the metal intercon-nects 37 as shown in FIG. 18B in the second conventional example. Therefore, the volume of each air gap 24 or 39 is reduced in a region of the upper interlayer insulating film 23 or 38 between the upper ends of the metal interconnects 21 or 37.

Accordingly, in the first or second conventional example, since the volume of each air gap 24 or 39 is thus reduced in the region between the upper ends of the metal interconnects 21 or 37 where the electric field is collected, the capacitance between the interconnects cannot be sufficiently reduced. In other words, although the first or second conventional example employs the metal interconnect structure having an air gap and the portions of the lower interlayer insulating film 11 or 31 between the metal interconnects 21 37 are trenched before forming the upper interlayer insulating film 23 or 38 so as to reduce the capacitance between the interconnects, the capacitance between the interconnects cannot be sufficiently reduced by these conventional techniques.

SUMMARY OF THE INVENTION

In consideration of the aforementioned conventional problem, an object of the invention is definitely reducing capacitance between interconnects in a semiconductor device having a metal interconnect structure including an air gap.

In order to achieve the object, the semiconductor device of this invention comprises a plurality of metal interconnects formed on a lower interlayer insulating film provided on a semiconductor substrate; and an upper interlayer insulating film covering the plurality of metal interconnects and having an air gap between the plurality of metal interconnects, and a top portion of the air gap is positioned at a level higher than the plurality of metal interconnects.

In the semiconductor device of this invention, since the top portion of the air gap is positioned at a level higher than the metal interconnects, a main portion of the air gap, namely, a portion with a rectangular cross-section, is positioned at the same level as the metal interconnects. Therefore, the volume of the air gap in a region between the upper ends of the metal interconnects where an electric field is collected can be increased, so as to sufficiently reduce the capacitance between the interconnects. As a result, the performance and the reliability of the semiconductor device can be improved.

In the semiconductor device, it is preferred that portions of the lower interlayer insulating film between the plurality of metal interconnects are trenched by etching, that a second insulating film made from a different material from the lower interlayer insulating film is formed on the plurality of metal interconnects with a first insulating film sandwiched therebetween, and that the lower interlayer insulating film has an etching rate higher than an etching rate of the second insulating film in the etching of the lower interlayer insulating film.

Since the portions of the lower interlayer insulating film between the plural metal interconnects are thus trenched by the etching, the lower end of the air gap is positioned at a level lower than the lower ends of the metal interconnects, and hence, the volume of the air gap in a region between the lower ends of the metal interconnects where an electric field is collected can be increased. Therefore, the capacitance between the interconnects can be further reduced.

Furthermore, since the second insulating film made from a different material from the lower interlayer insulating film and having an etching rate lower than that of the lower interlayer insulating film in etching the lower interlayer insulating film is formed on the plural metal interconnects with the first insulating film sandwiched therebetween, no facet is formed in a top portion of the first insulating film when the lower interlayer insulating film is etched. Therefore, the upper interlayer insulating film minimally enters the portions between the metal interconnects, and hence, the top portion of the air gap can be definitely positioned at a level higher than the metal interconnects.

In the semiconductor device, it is preferred that the lower interlayer insulating film is made from an inorganic insulating material including an inorganic component as a principal constituent and including neither nitrogen nor carbon, or a hybrid insulating material including an organic component and an inorganic component, and that the second insulating film is made from an inorganic insulating material including an inorganic material as a principal constituent and including nitrogen or carbon.

Thus, the lower interlayer insulating film can easily attain an etching rate higher than that of the second insulating film in etching the lower interlayer insulating film.

In the semiconductor device, it is preferred that the lower interlayer insulating film is made from an organic insulating material including an organic component as a principal constituent, and that the second insulating film is made from an inorganic insulating material including an inorganic component as a principal constituent or a hybrid insulating material including an organic component and an inorganic component.

Thus, the lower interlayer insulating film can easily attain an etching rate higher than that the second insulating film in etching the lower interlayer insulating film.

In the semiconductor device, it is preferred that the lower interlayer insulating film is made from an inorganic or organic porous insulating material, and that the second insulating film is made from an inorganic insulating material including an inorganic component as a principal constituent or a hybrid insulating material including an organic component and an inorganic component.

Thus, the lower interlayer insulating film can easily attain an etching rate higher than that of the second insulating film in etching the lower interlayer insulating film.

The first method for fabricating a semiconductor device of this invention comprises the steps of depositing a first metal film on a lower interlayer insulating film formed on a semiconductor substrate; forming a second insulating film made from a different material from the lower interlayer insulating film on the first metal film with a first insulating film sandwiched therebetween; forming a contact plug opening in the second insulating film and the first insulating film; forming a contact plug by filling the contact plug opening with a second metal film; forming a transfer pattern composed of a patterned second insulating film, a patterned first insulating film and the contact plug by etching the second insulating film and the first insulating film with a mask pattern formed on the second insulating film in an interconnect pattern used as a mask; forming metal interconnects from the first metal film by etching the first metal film with the transfer pattern used as a mask; trenching portions of the lower interlayer insulating film between the metal interconnects by etching the lower interlayer insulating film under conditions in which the lower interlayer insulating film has an etching rate higher than an etching rate of the second insulating film; and forming an upper interlayer insulating film on the lower interlayer insulating film, whereby covering the patterned second insulating film and forming an air gap between the metal interconnects.

In the first method for fabricating a semiconductor device of this invention, the lower interlayer insulating film is etched under conditions in which the etching rate of the lower interlayer insulating film is higher than that of the second insulating film so as to trench the portions of the lower interlayer insulating film between the metal interconnects. Therefore, no facet is formed in a top portion of the first insulating film, and hence, the upper interlayer insulating film minimally enters the portion between the metal interconnects. Accordingly, the top portion of the air gap can be positioned at a level higher than the metal interconnects so as to increase the volume of the air gap in a region between the upper ends of the metal interconnects where an electric field is collected. As a result, the capacitance between the interconnects can be sufficiently reduced.

The second method for fabricating a semiconductor device of this invention comprises the steps of depositing a first metal film on a lower interlayer insulating film formed on a semiconductor substrate; forming a second insulating film from a different material from the lower interlayer insulating film on the first metal film with a first insulating film sandwiched therebetween; forming a transfer pattern composed of a patterned second insulating film and a patterned first insulating film by etching the second insulating film and the first insulating film with a mask pattern formed on the second insulating film in an interconnect pattern used as a mask; forming metal interconnects from the first metal film by etching the first metal film with the transfer pattern used as a mask; trenching portions of the lower interlayer insulating film between the metal interconnects by etching the lower interlayer insulating film under conditions in which the lower interlayer insulating film has an etching rate higher than an etching rate of the second insulating film; and forming an upper interlayer insulating film on the lower interlayer insulating film, whereby covering the patterned second insulating film and forming an air gap between the metal interconnects.

In the second method for fabricating a semiconductor device of this invention, the lower interlayer insulating film is etched under conditions in which the etching rate of the lower interlayer insulating film is higher than that of the second insulating film so as to trench the portions of the lower interlayer insulating film between the metal interconnects. Therefore, no facet is formed in a top portion of the first insulating film, and hence, the upper interlayer insulating film minimally enters the portion between the metal interconnects. Accordingly, the top portion of the air gap can be positioned at a level higher than the metal interconnects so as to increase the volume of the air gap in a region between the upper ends of the metal interconnects where an electric field is collected. As a result, the capacitance between the interconnects can be sufficiently reduced.

In the first or second method for fabricating a semiconductor device, it is preferred that a top portion of the air gap is positioned at a level higher than the metal interconnects.

Thus, the volume of the air gap in the region between the upper ends of the metal interconnects where an electric field is collected can be definitely increased, resulting in definitely reducing the capacitance between the interconnects.

In the first or second method for fabricating a semiconductor device, it is preferred that the lower interlayer insulating film is made from an inorganic insulating material including an inorganic component as a principal constituent and including neither nitrogen nor carbon, or a hybrid insulating material including an organic component and an inorganic component, and that the second insulating film is made from an inorganic insulating material including an inorganic material as a principal constituent and including nitrogen or carbon.

Thus, the lower interlayer insulating film can easily attain an etching rate higher than that of the second insulating film in etching the lower interlayer insulating film.

In the first or second method for fabricating a semiconductor device, it is preferred that the lower interlayer insulating film is made from an organic insulating material including an organic component as a principal constituent, and that the second insulating film is made from an inorganic insulating material including an inorganic component as a principal constituent or a hybrid insulating material including an organic component and an inorganic component.

Thus, the lower interlayer insulating film can easily attain an etching rate higher than that of the second insulating film in etching the lower interlayer insulating film.

In the first or second method for fabricating a semiconductor device, it is preferred that the lower interlayer insulating film is made from an inorganic or organic porous insulating material, and that the second insulating film is made from an inorganic insulating material including an inorganic component as a principal constituent or a hybrid insulating material including an organic component and an inorganic component.

Thus, the lower interlayer insulating film can easily attain an etching rate higher than that of the second insulating film in etching the lower interlayer insulating film.

DETAILED DESCRIPTION OF THE INVENTION

Embodiment 1

A semiconductor device and a method for fabricating the same according to Embodiment 1 of the invention will now be described with reference to FIGS. 1A through 1C, 2A through 2C, 3A through 3C, 4A through 4C and 5A through 5C.

Figure 1A:
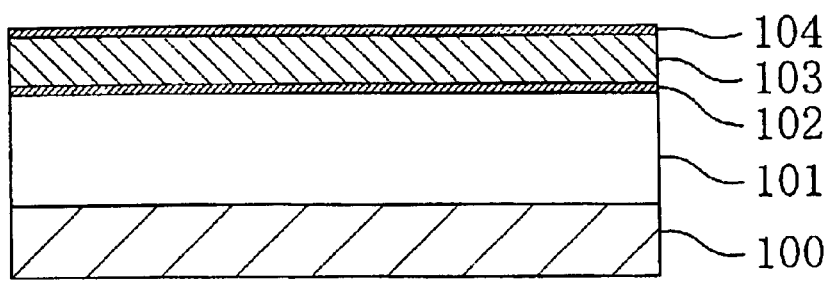
FIGS. 1A, 1B and 1C are cross-sectional views for showing procedures in a method for fabricating a semiconductor device according to Embodiment 1 of the invention.

First, as shown in FIG. 1A, a lower interlayer insulating film 101 of an insulating material is formed on a semiconductor substrate 100 by CVD or spin coating. Thereafter, although not shown in the drawing, a plug connected to the semiconductor substrate 100 or an interconnect formed on the semiconductor substrate 100 is formed in the lower interlayer insulating film 101.

Next, a first barrier metal layer 102, a first metal film 103 and a second barrier metal layer 104 are successively deposited on the lower interlayer insulating film 101. The first barrier metal layer 102 and the second barrier metal layer 104 are deposited by sputtering and the first metal film 103 is formed by the sputtering, CVD or plating. The first metal film 103 may be made from a metal with low resistance such as aluminum alloy, copper, gold, silver or platinum, and the first barrier metal layer 102 and the second barrier metal layer 104 may be made from a nitride of a metal with a high melting point such as titanium nitride or tantalum nitride.

Figure 1B:
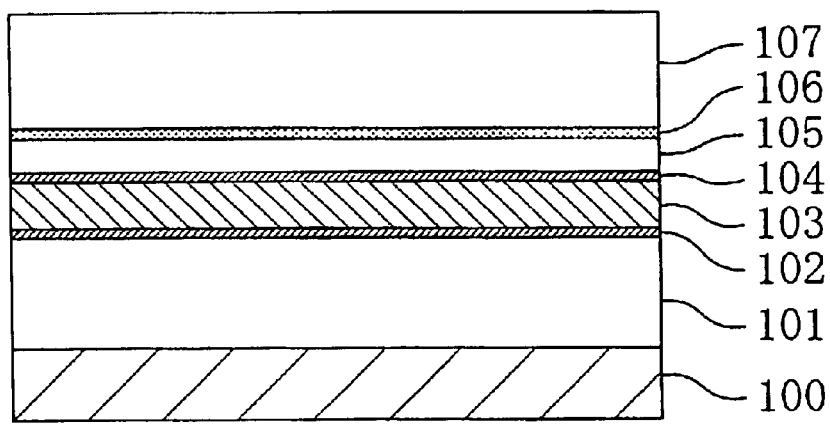

Then, as shown in FIG. 1B, a first insulating film 105, a second insulating film 106 and a third insulating film 107 are successively formed on the second barrier metal layer 104 by the CVD or spin coating. In this case, the second insulating film 106 is made from a different material from the first insulating film 105, and the third insulating film 107 is made from a different material from the second insulating film 106. Also, the second insulating film 106 is made from an insulating material having a lower etching rate than the lower interlayer insulating film 101 in etching the lower interlayer insulating film 101. The insulating materials used for the lower interlayer insulating film 101, the first insulating film 105, the second insulating film 106 and the third insulating film 107 will be described in detail later.

Figure 1C:
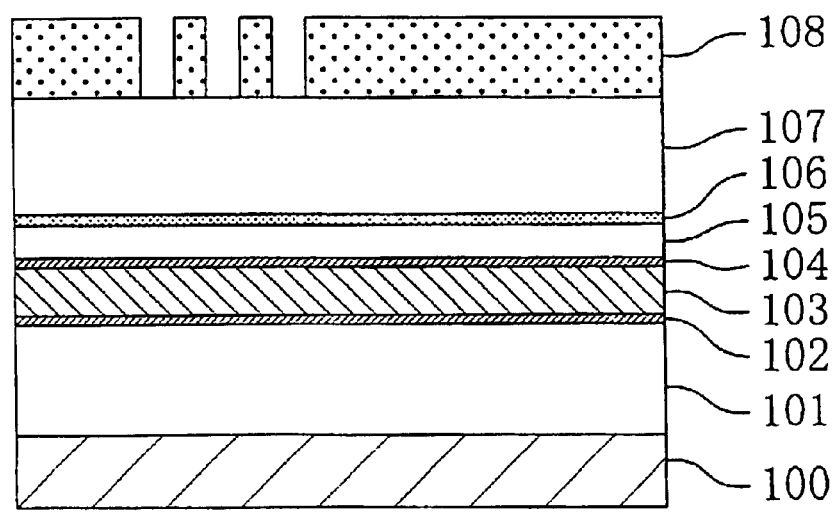
Figure 2A:
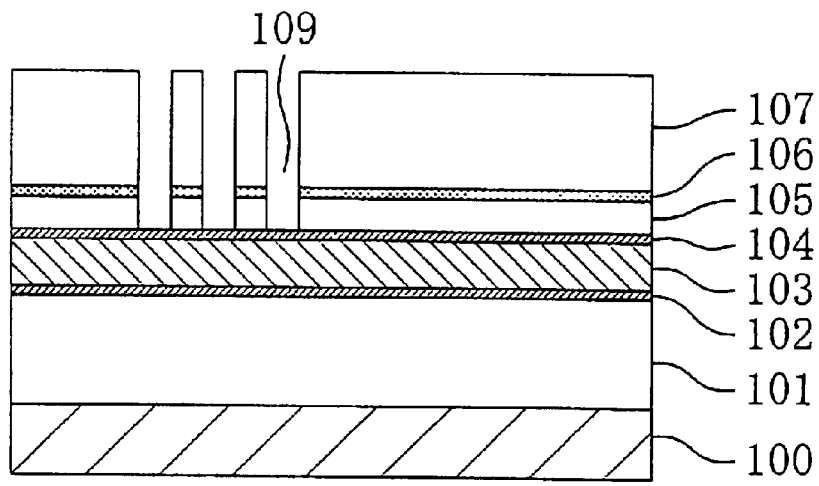
FIGS. 2A, 2B and 2C are cross-sectional views for showing other procedures in the method for fabricating a semiconductor device of Embodiment 1.

Next, after forming a first resist pattern 108 on the third insulating film 107 by lithography as shown in FIG. 1C, the third insulating film 107, the second insulating film 106 and the first insulating film 105 are dry etched by using the first resist pattern 108 as a mask, thereby forming plug openings 109 as shown in FIG. 2A.

Figure 2B:
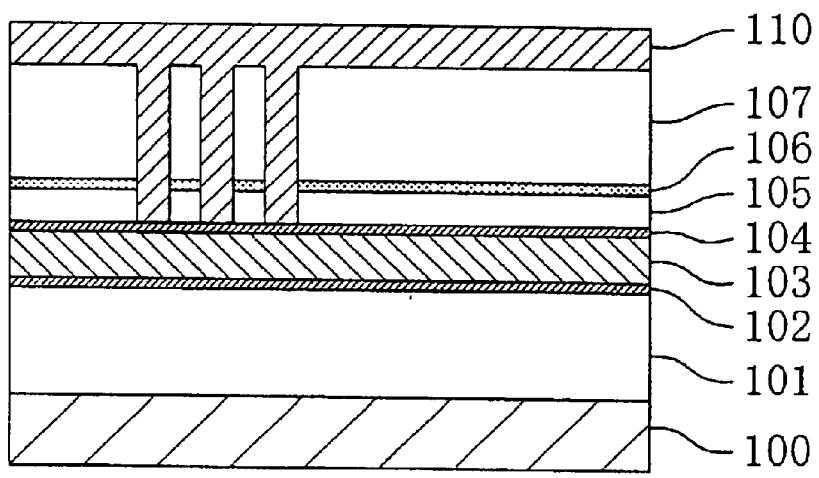
Figure 2C:
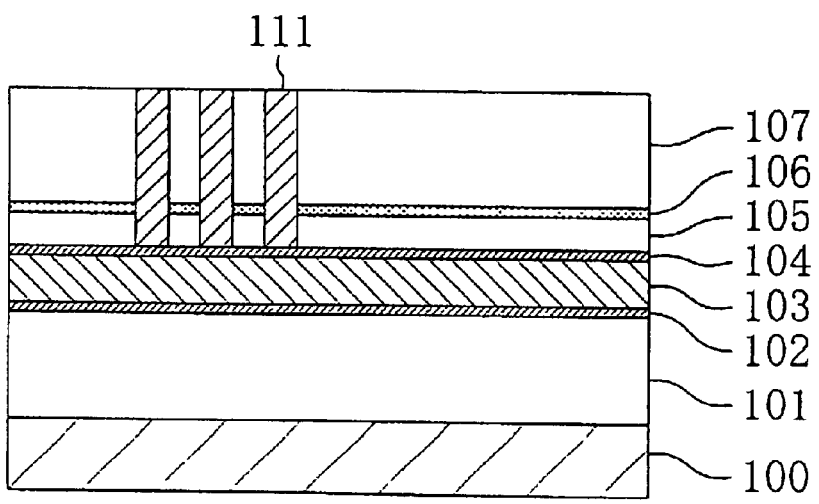

Then, after depositing a second metal film 110 on the third insulating film 107 by the sputtering, CVD or plating as shown in FIG. 2B, an unnecessary portion of the second metal film 110 present on the third insulating film 107 is removed by CMP, thereby forming contact plugs 111 from the second metal film 110 as shown in FIG. 2C.

Figure 3A:
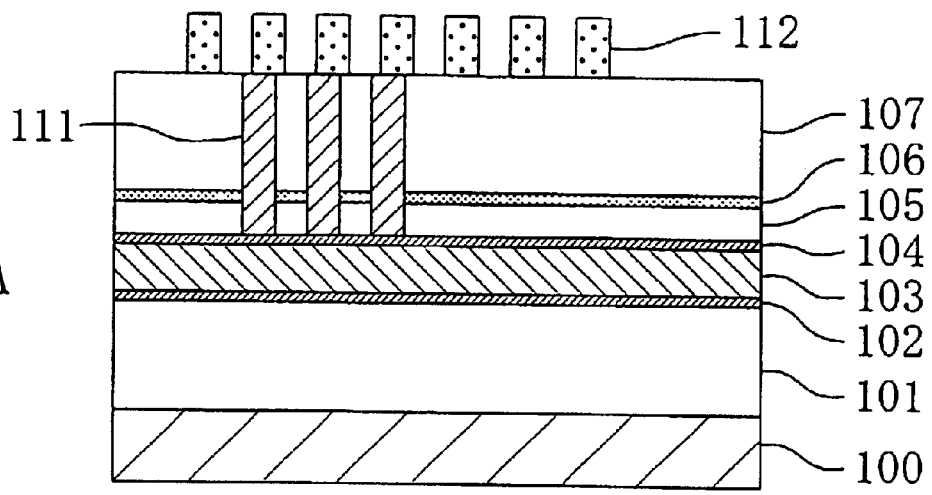
FIGS. 3A, 3B and 3C are cross-sectional views for showing still other procedures in the method for, fabricating a semiconductor device of Embodiment 1.
Figure 3B:
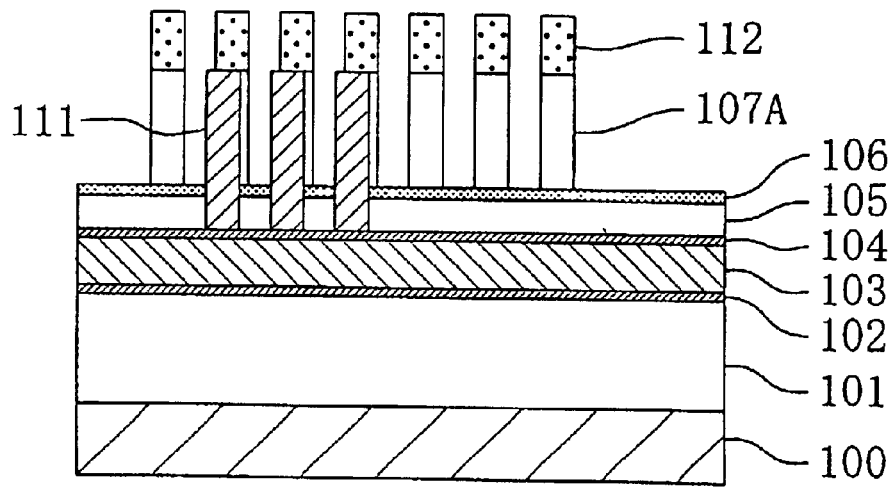

Next, after forming a second resist pattern 112 on the third insulating film 107 as shown in FIG. 3A, the third insulating film 107 is dry etched by using the second resist pattern 112 as a mask, so as to form a patterned third insulating film 107A in the pattern of interconnects as shown in FIG. 3B.

Figure 3C:
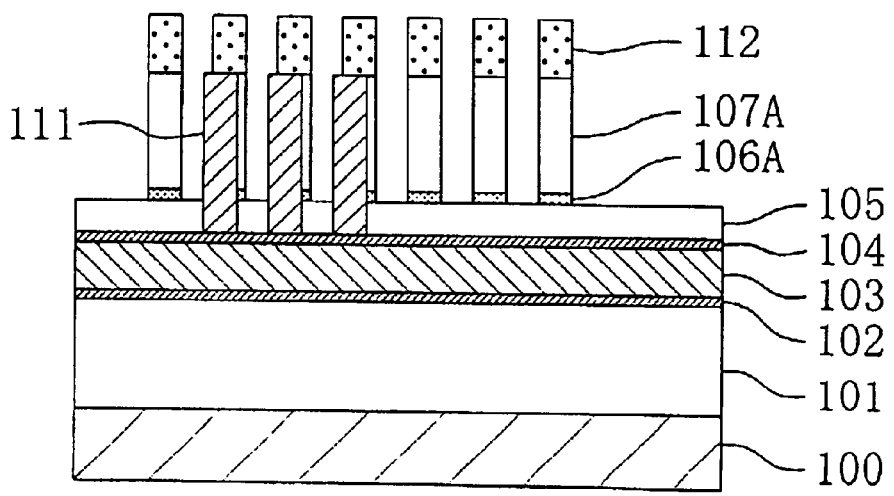

Then, as shown in FIG. 3C, the second insulating film 106 is dry etched by using the second resist pattern 112 and the patterned third insulating film 107A as a mask, so as to form a patterned second insulating film 106A in the pattern of interconnects.

Figure 4A:
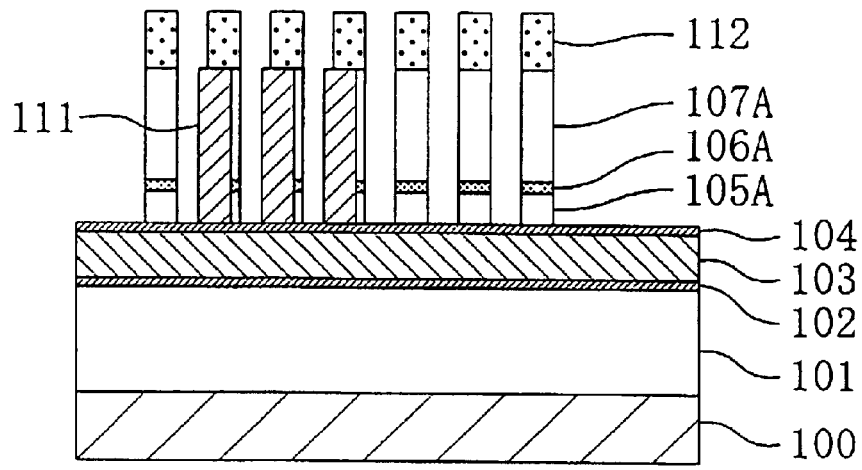
FIGS. 4A, 4B and 4C are cross-sectional views for showing still other procedures in the method for fabricating a semiconductor device of Embodiment 1.
Figure 4B:
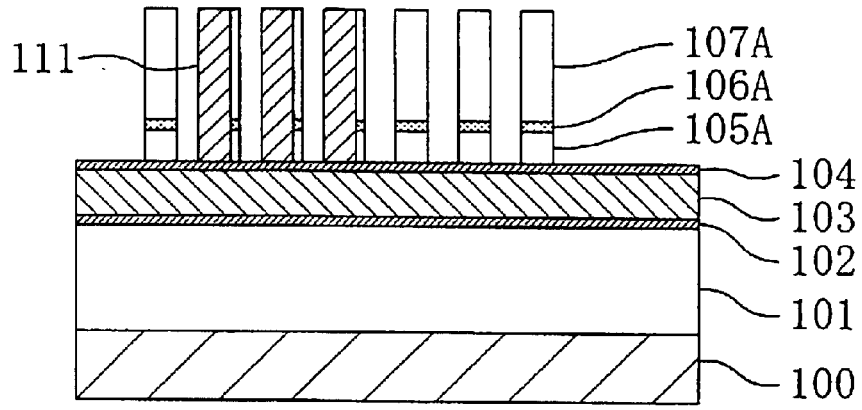

Subsequently, as shown in FIG. 4A, the first insulating film 105 is dry etched by using the second resist pattern 112, the patterned third insulating film 107A and the patterned second insulating film 106A as a mask, so as to form a patterned first insulating film 105A in the pattern of interconnects. In this manner, a transfer pattern composed of the patterned third insulating film 107A, the patterned second insulating film 106A, the patterned first insulating film 105A and the contact plugs 111 is formed. Thereafter, the second resist pattern 112 is removed by ashing as shown in FIG. 4B, and the resultant semiconductor substrate is cleaned.

Figure 4C:
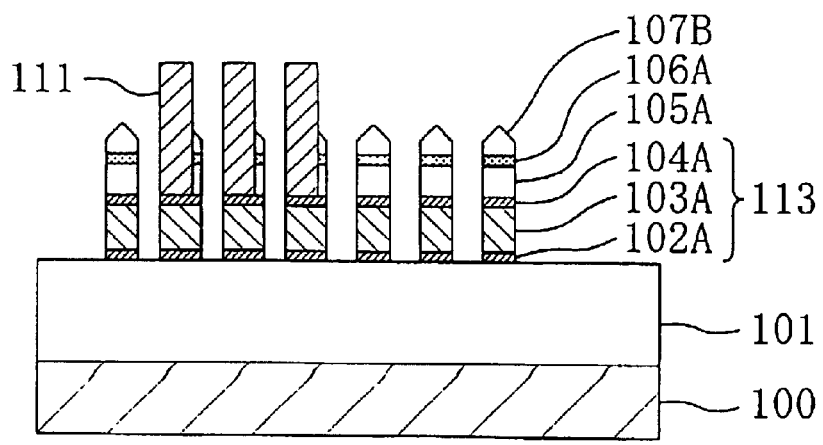

Next, as shown in FIG. 4C, the second barrier metal layer 104, the first metal film 103 and the first barrier metal layer 102 are dry etched by using the transfer pattern as a mask, thereby forming metal interconnects 113 composed of a patterned second barrier metal layer 104A, a patterned first metal film 103A and a patterned first barrier metal layer 102A. In this manner, the patterned third insulating film 107A is sputtered, and hence is formed into a third insulating film 107B having facets in top portions thereof.

Figure 5A:
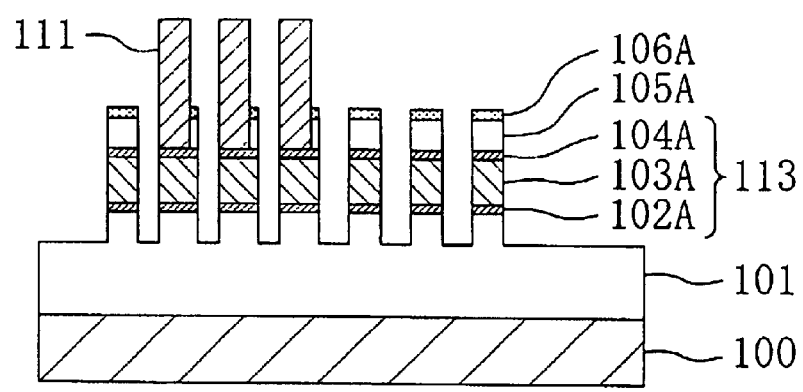
FIGS. 5A, 5B and 5C are cross-sectional views for showing still other procedures in the method for fabricating a semiconductor device of Embodiment 1.

Then, as shown in FIG. 5A, the lower interlayer insulating film 101 is dry etched under conditions in which the etching rate of the lower interlayer insulating film 101 is higher than the etching rate of the second insulating film 106, thereby trenching portions of the lower interlayer insulating film 101 between the metal interconnects 113. In this etching, although the third insulating film 107B having the facets in the top portions thereof is removed, the patterned second insulating film 106A and the patterned first insulating film 105A still have a rectangular cross-section. In other words, no facets are formed in the top portions of the patterned second insulating film 106A and the patterned first insulating film 105A. In this etching, even when the third insulating film 107B having the facets in the top portions thereof is not completely removed, it is harmless.

Figure 5B:
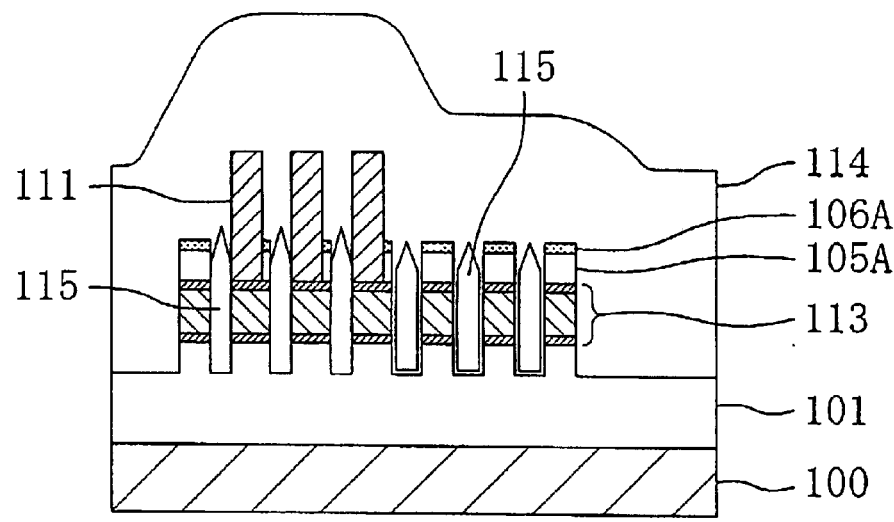

Next, as shown in FIG. 5B, an upper interlayer insulating film 114 is formed over the patterned second insulating film 106A, the contact plugs 111 and the lower interlayer insulating film 101 by the CVD, and air gaps 115 are formed in the upper interlayer insulating film 114 between the metal interconnects 113. Since this procedure for forming the upper interlayer insulating film 114 is carried out with no facets formed in the top portions of the patterned second insulating film 106A and the patterned first insulating film 105A, the upper interlayer insulating film 114 minimally enters the portions between the metal interconnects 113. Therefore, the top portion of each air gap 115 (a portion with a triangular cross-section) is positioned at a level higher than the metal interconnect 113.

Figure 5C:
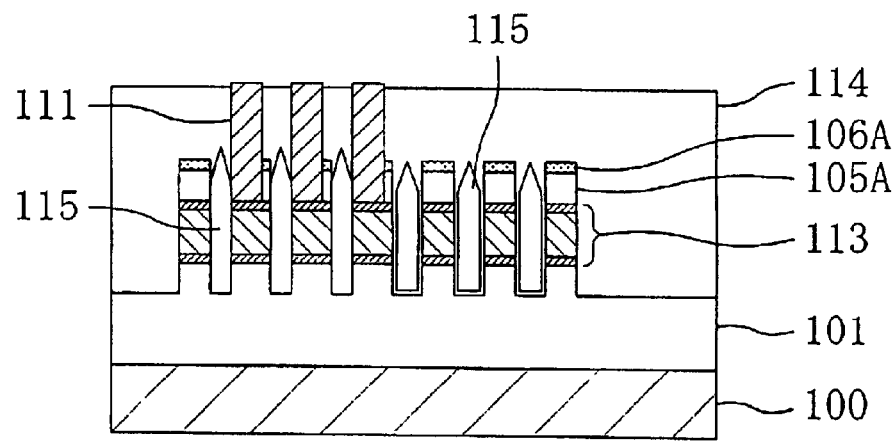

Then, as shown in FIG. 5C, the upper interlayer insulating film 114 is planarized by the CMP. Thus, an interconnect structure having an air gap is obtained. Thereafter, the aforementioned sequence is repeated, so as to fabricate a semiconductor device having a multi-layer interconnect structure.

Figure 6A:
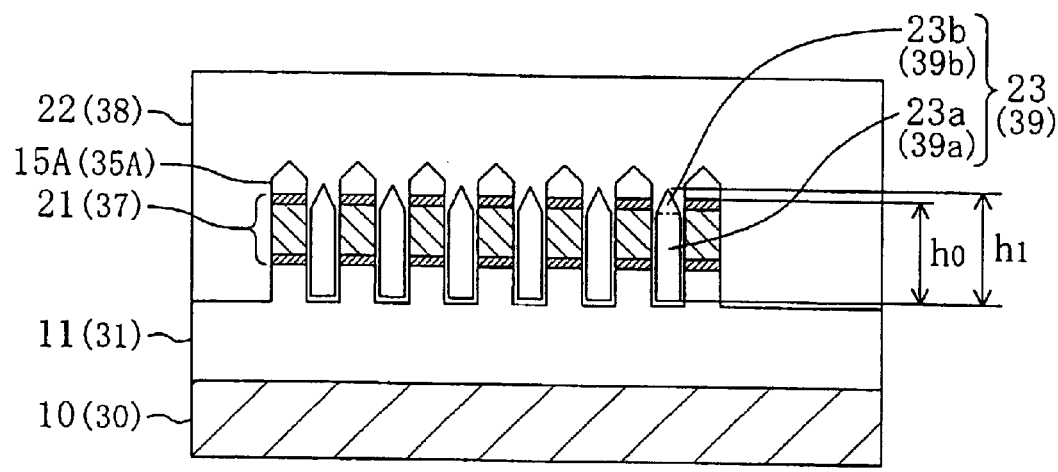
FIG. 6A is a cross-sectional view of a semiconductor device according to a first or second conventional example and FIG. 6B is a cross-sectional view of a semiconductor device of Embodiment 1.
Figure 6B:
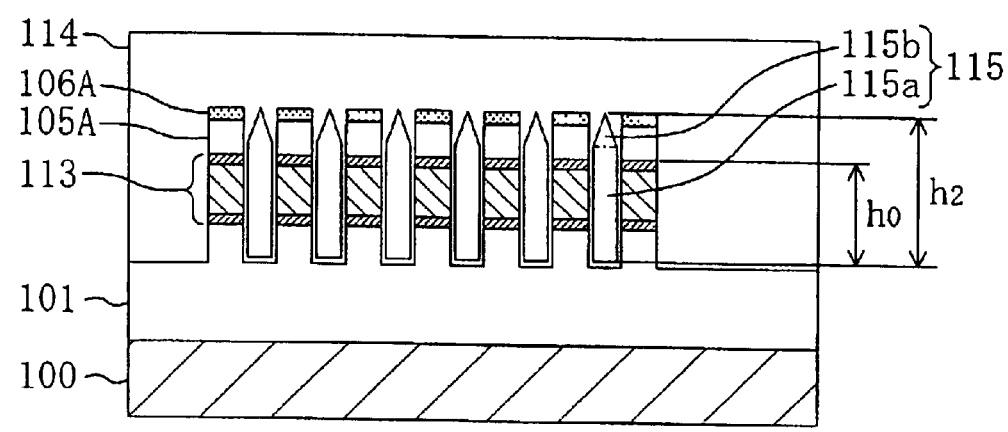

FIG. 6A shows the cross-sectional structure of a semiconductor device according to the first or second conventional example and FIG. 6B shows the cross-sectional structure of the semiconductor device of Embodiment 1.

As is obvious from FIG. 6A, since the patterned insulating film 15A (35A) has the facets in the top portions thereof in the semiconductor device of the first or second conventional example, the upper interlayer insulating film 22 (38) tends to enter the portions between the metal interconnects 21 (37). Therefore, the height $h_1$ of each air gap 23 (39) composed of a main portion 23a (39a) (with a rectangular cross-section) and a top portion 23b (39b) (with a triangular cross-section) is merely slightly larger than the height $h_0$ of the metal interconnect 21 (37) above the bottom of the air gap. Accordingly, the top portion 23b (39b) of the air gap 23 (39) is positioned at substantially the same level as the metal interconnect 21 (39).

In contrast, as is obvious from FIG. 6B, since no facets are formed in the top portions of the patterned second insulating film 106A and the patterned first insulating film 105A in the semiconductor device of Embodiment 1, the upper interlayer insulating film 114 minimally enters the portions between the metal interconnects 113. Therefore, the height $h_2$ of each air gap 115 composed of a main portion 115a (with a rectangular cross-section) and a top portion 115b (with a triangular cross-section) is much larger than the height $h_0$ of the metal interconnect 113 above the bottom of the air gap. Accordingly, the top portion 115b of the air gap 115 is positioned at a level higher than the metal interconnect 113.

According to Embodiment 1, since the top portion 115b of each air gap 115 is positioned at the level higher than the metal interconnect 113, the volume of the air gap 115 in a region between the upper ends of the metal interconnects 113 where an electric field is collected can be increased. As a result, the capacitance between the interconnects can be sufficiently reduced, so as to improve the performance and the reliability of the semiconductor device.

Embodiment 2

A semiconductor device and a method for fabricating the same according to Embodiment 2 of the invention will now be described with reference to FIGS. 7A through 7C, 8A through 8C, 9A through 9C and 10A through 10C.

Figure 7A:
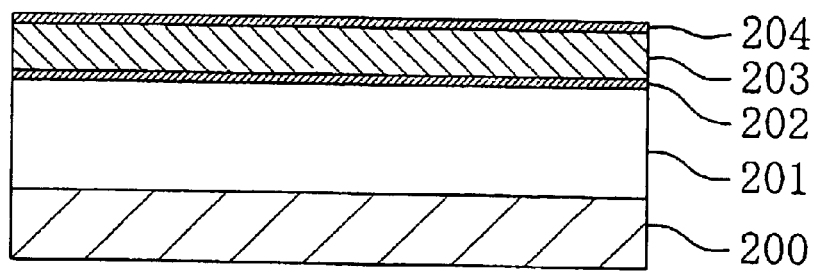
FIGS. 7A, 7B and 7C are cross-sectional views for showing procedures in a method for fabricating a semiconductor device according to Embodiment 2 of the invention.

First, as shown in FIG. 7A, a lower interlayer insulating film 201 of an insulating material is formed on a semiconductor substrate 200 by the CVD or spin coating in the same manner as in Embodiment 1. Thereafter, although not shown in the drawing, a plug connected to the semiconductor substrate 200 or an interconnect formed on the semiconductor substrate 200 is formed in the lower interlayer insulating film 201. Then, a first barrier metal layer 202, a first metal film 203 and a second barrier metal layer 204 are successively deposited on the lower interlayer insulating film 201.

Figure 7B:
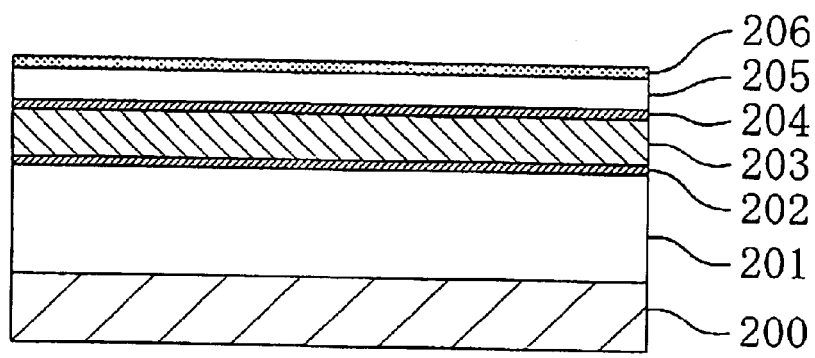

Next, as shown in FIG. 7B, a first insulating film 205 and a second insulating film 206 are successively formed on the second barrier metal layer 204 by the CVD or spin coating. In this case, the second insulating film 206 is made from a different material from the first insulating film 205. Also, the second insulating film 206 is made from an insulating material having a lower etching rate than the lower interlayer insulating film 201 in etching the lower interlayer insulating film 201. The insulating materials used for the lower interlayer insulating film 201, the first insulating film 205 and the second insulating film 206 will be described in detail later.

Figure 7C:
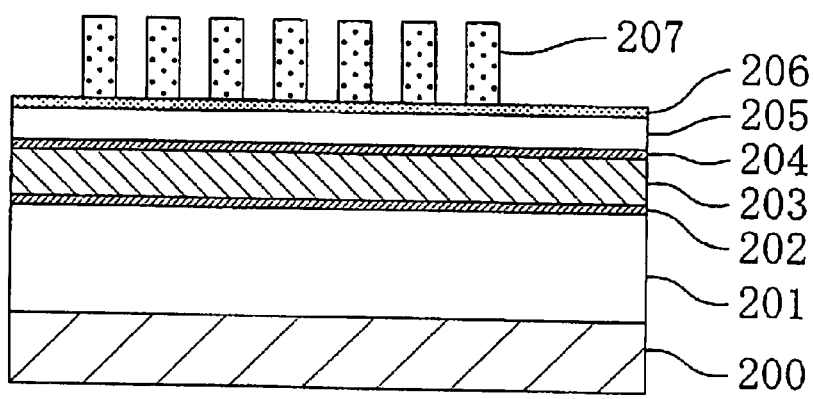
Figure 8A:
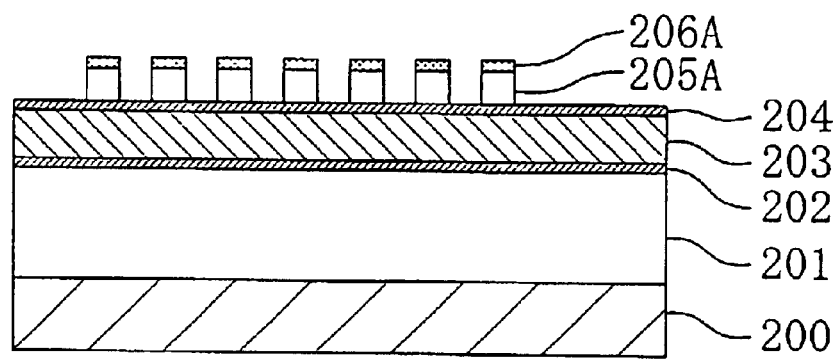
FIGS. 8A, 8B and 8C are cross-sectional views for showing other procedures in the method for fabricating a semiconductor device of Embodiment 2.

Then, after forming a first resist pattern 207 on the second insulating film 206 as shown in FIG. 7C, the second insulating film 206 and the first insulating film 205 are dry etched by using the first resist pattern 207 as a mask, thereby forming a patterned second insulating film 206A and a patterned first insulating film 205A both in the pattern of interconnects as shown in FIG. 8A. Thus, a transfer pattern composed of the patterned second insulating film 206A and the patterned first insulating film 205A is formed. Thereafter, the first resist pattern 207 is removed by the ashing, and the resultant substrate is cleaned.

Figure 8B:
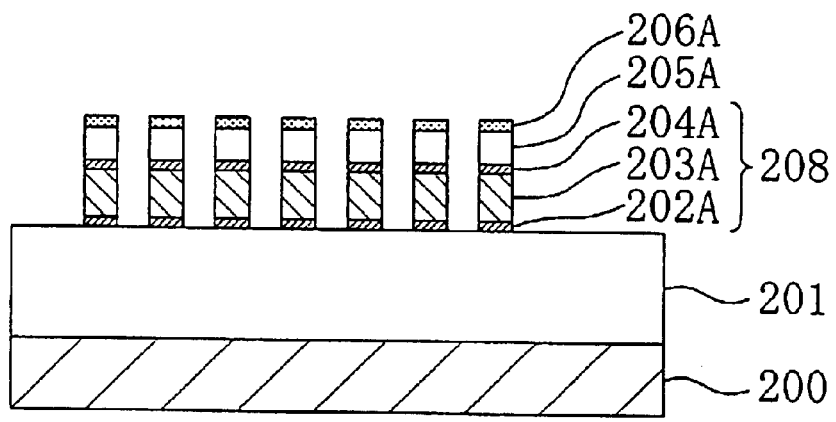

Next, as shown in FIG. 8B, the second barrier metal layer 204, the first metal film 203 and the first barrier metal layer 202 are dry etched by using the transfer pattern as a mask, thereby forming metal interconnects 208 composed of a patterned second barrier metal layer 204A, a patterned first metal film 203A and a patterned first barrier metal layer 202A.

Figure 8C:
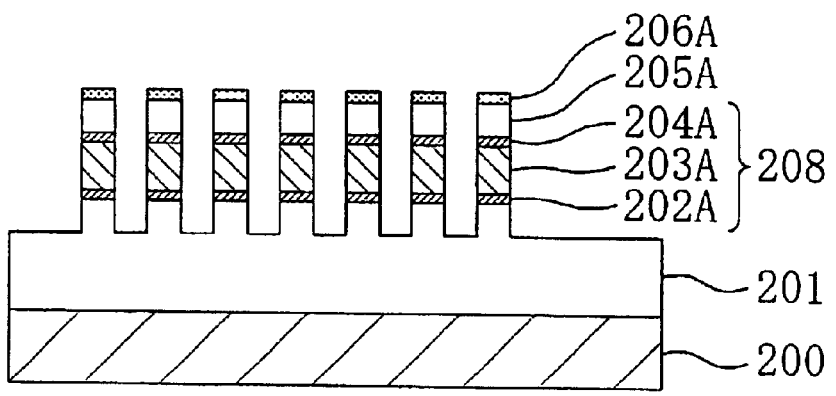

Then, as shown in FIG. 8C, the lower interlayer insulating film 201 is dry etched under conditions in which the etching rate of the lower interlayer insulating film 201 is higher than the etching rate of the second insulating film 206, thereby trenching portions of the lower interlayer insulating film 201 between the metal interconnects 208. In this etching, the patterned second insulating film 206A and the patterned first insulating film 205A keep their rectangular cross-section, namely, no facets are formed in top portions of the patterned second insulating film 206A and the patterned first insulating film 205A.

Figure 9A:
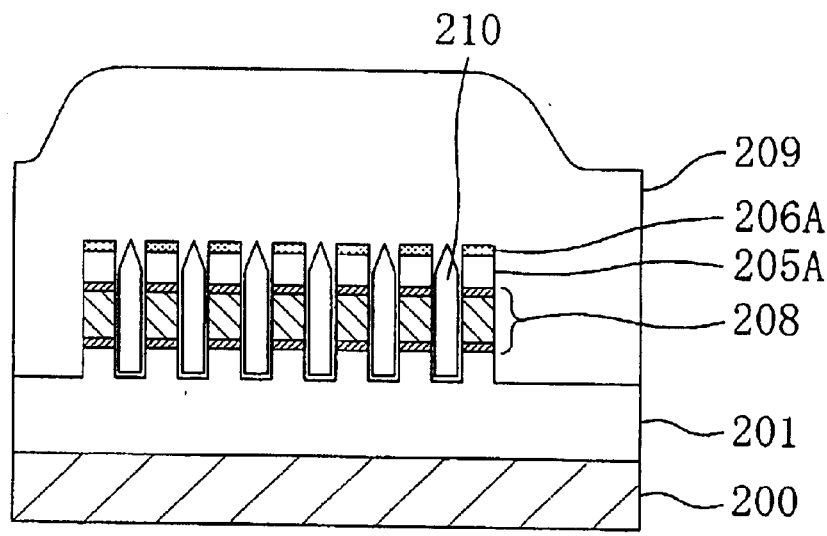
FIGS. 9A, 9B and 9C are cross-sectional views for showing still other procedures in the method for fabricating a semiconductor device of Embodiment 2.

Subsequently, as shown in FIG. 9A, an upper interlayer insulating film 209 is formed over the metal interconnects 208 and the lower interlayer insulating film 201 by the CVD, and air gaps 210 are formed in the upper interlayer insulating film 209 between the metal interconnects 208. The procedure for forming the upper interlayer insulating film 209 is carried out with no facets formed in the top portions of the patterned second insulating film 206A and the patterned first insulating film 205A. Therefore, the upper interlayer insulating film 209 minimally enters the portions between the metal interconnects 208, and hence, a top portion of each air gap 210 (a portion with a triangular cross-section) is positioned at a level higher than the metal interconnect 208.

Figure 9B:
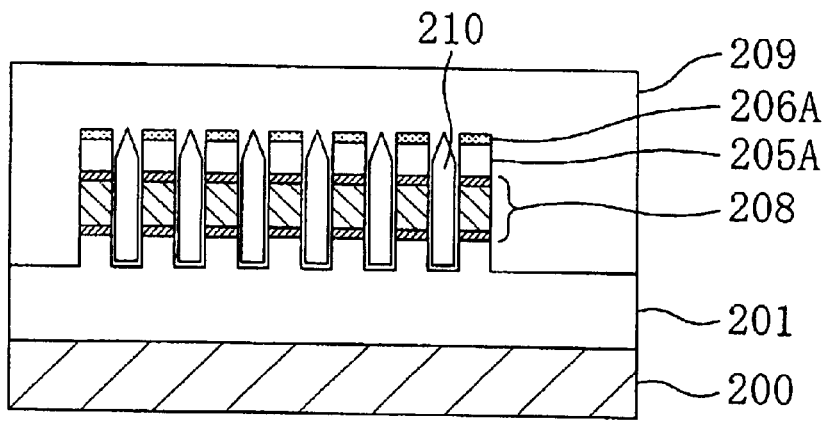
Figure 9C:
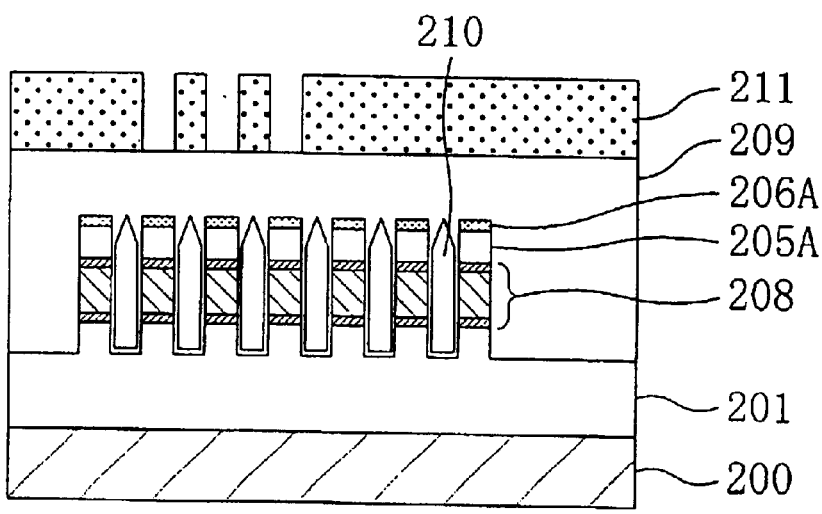

Next, after planarizing the upper interlayer insulating film 209 by the CMP as shown in FIG. 9B, a second resist pattern 211 is formed on the upper interlayer insulating film 209 as shown in FIG. 9C.

Figure 10A:
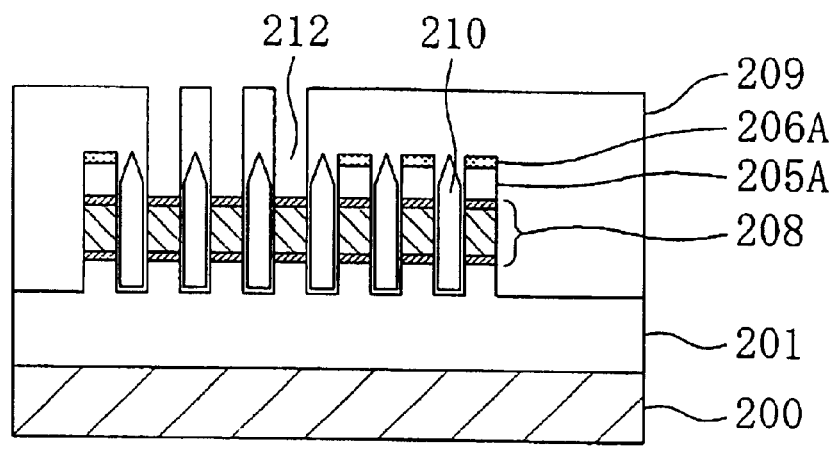
FIGS. 10A, 10B and 10C are cross-sectional views for showing still other procedures in the method for fabricating a semiconductor device of Embodiment 2.

Then, as shown in FIG. 10A, the upper interlayer insulating film 209 is dry etched by using the second resist pattern 211 as a mask, thereby forming plug openings 212 in the upper interlayer insulating film 209. Thereafter, the second resist pattern 211 is removed by the ashing.

Figure 10B:
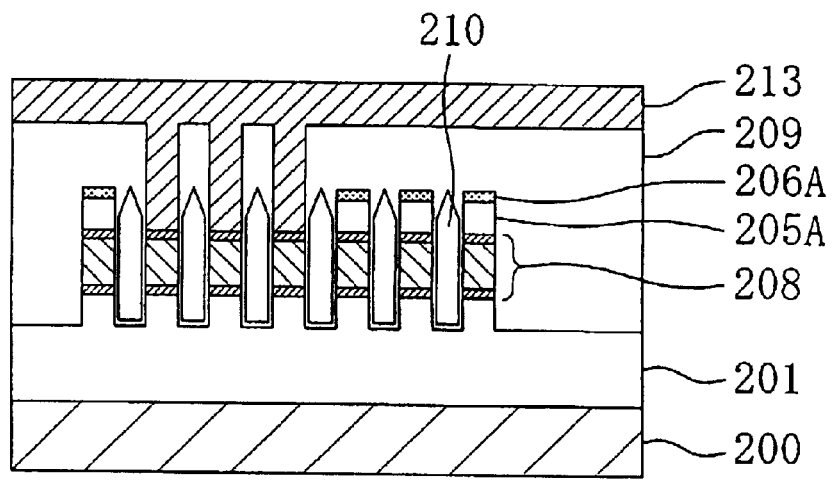

Next, as shown in FIG. 10B, a second metal film 213 is deposited on the upper interlayer insulating film 209 by the sputtering, CVD or plating so as to fill the plug openings 212.

Figure 10C:
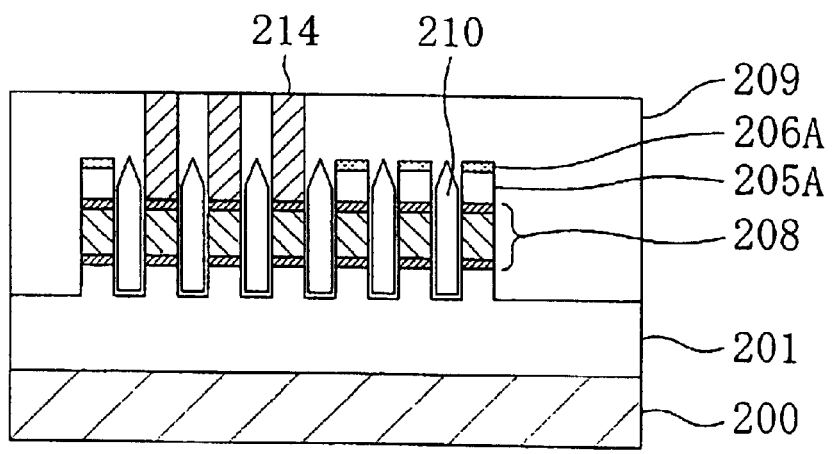
Figure 11A:
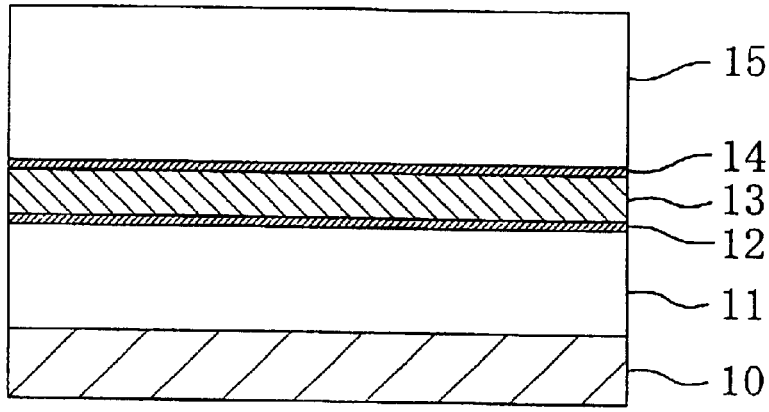
FIGS. 11A, 11B and 11C are cross-sectional views for showing procedures in a method for fabricating a semiconductor device according to the first conventional example.
Figure 11B:
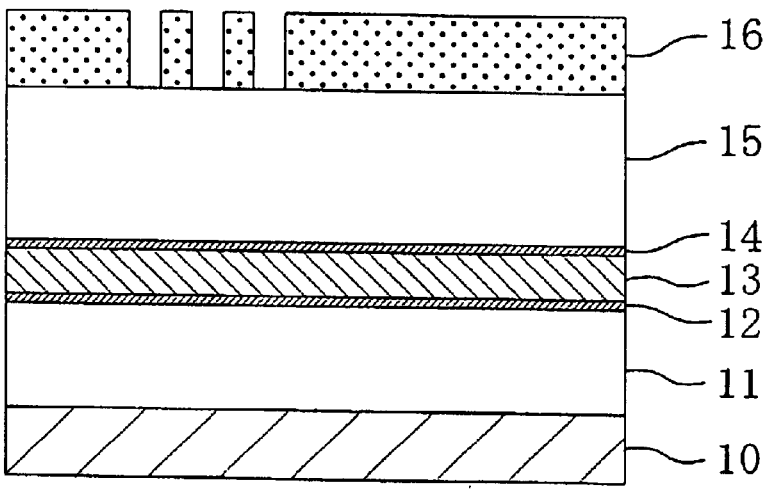
Figure 11C:
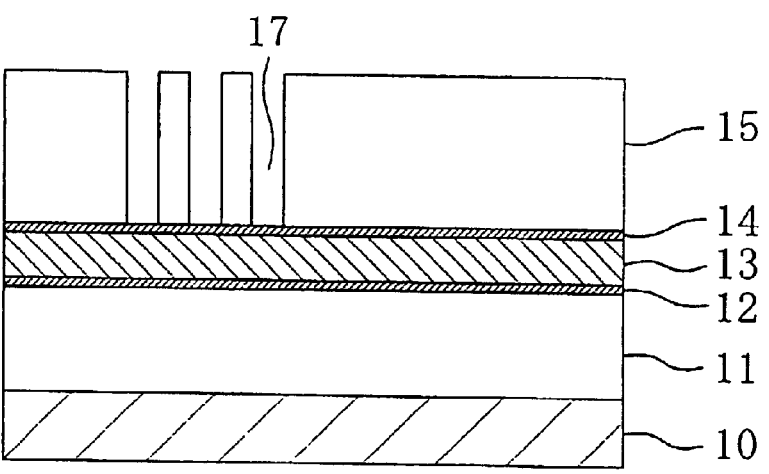
Figure 12A:
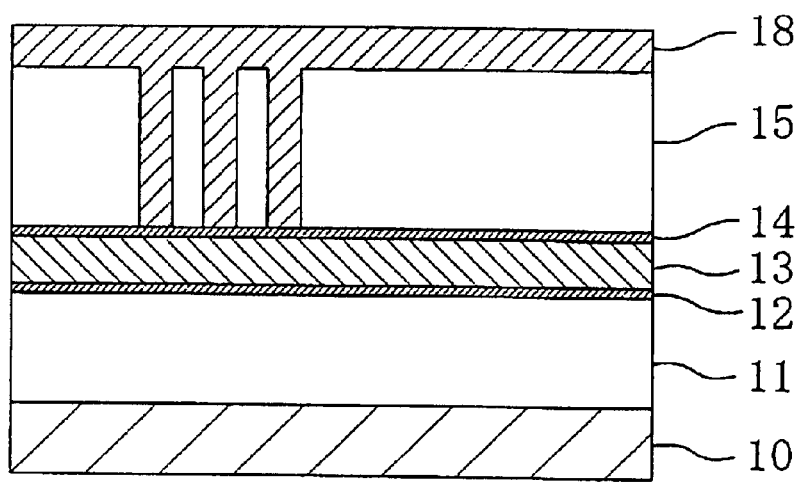
FIGS. 12A, 12B and 12C are cross-sectional views for showing other procedures in the method for fabricating a semiconductor device of the first conventional example.
Figure 12B:
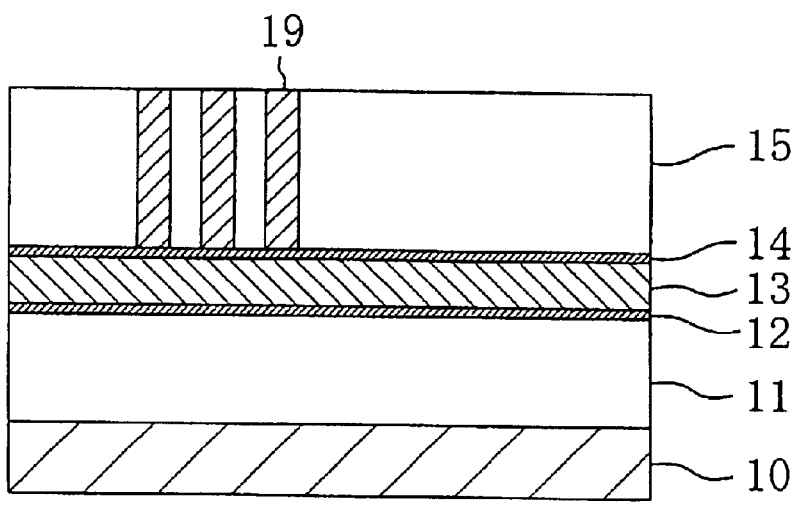
Figure 12C:
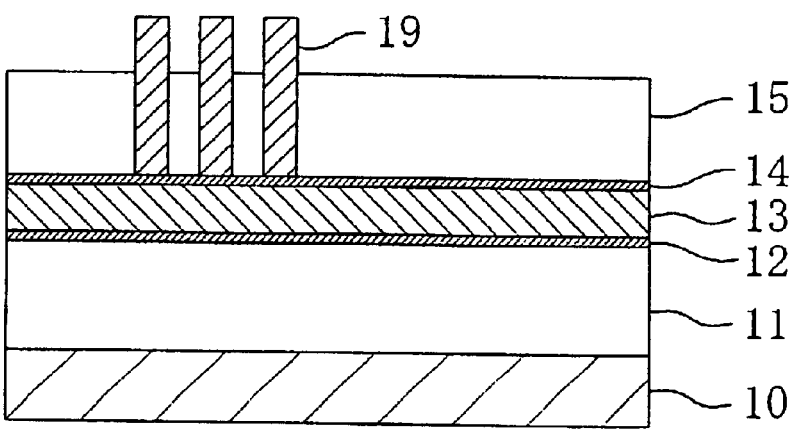
Figure 13A:
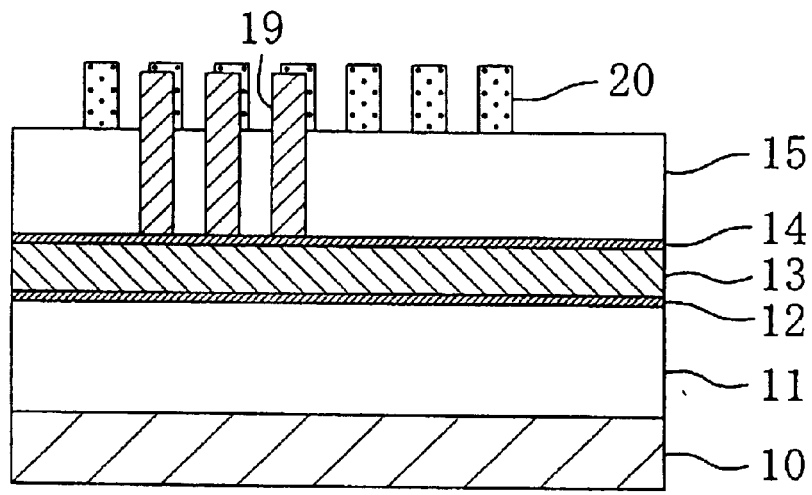
FIGS. 13A, 13B and 13C are cross-sectional views for showing still other procedures in the method for fabricating a semiconductor device of first conventional example.
Figure 13B:
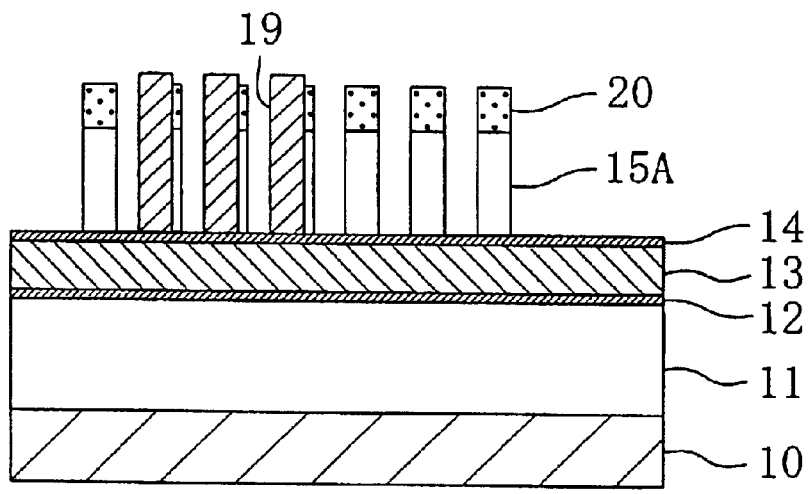
Figure 13C:
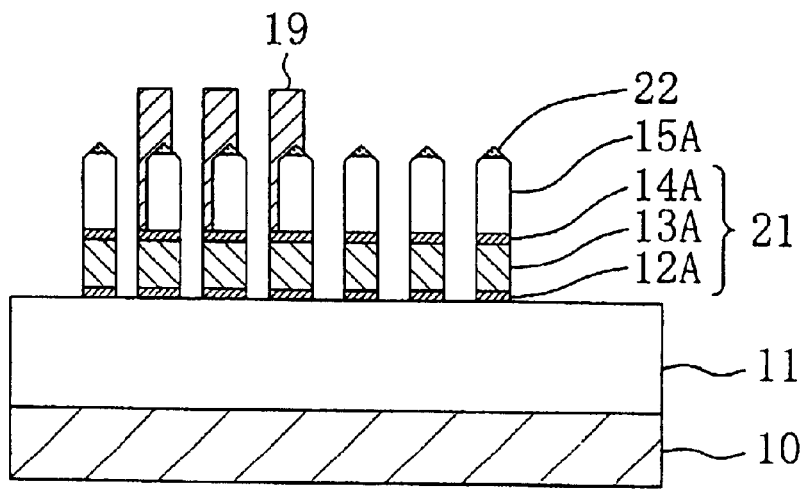
Figure 14A:
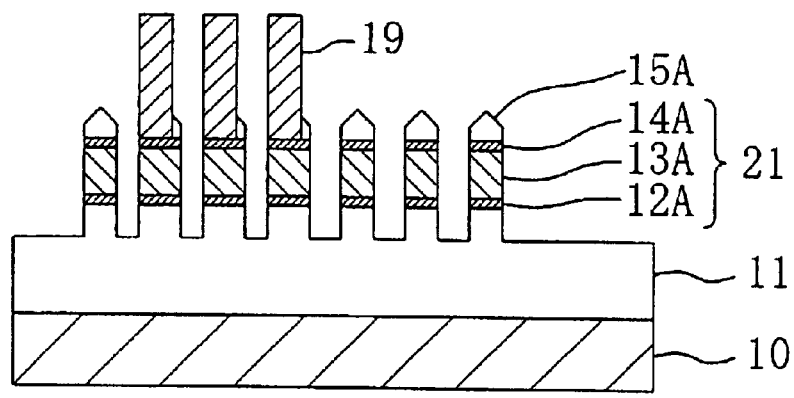
FIGS. 14A, 14B and 14C are cross-sectional views for showing still other procedures in the method for fabricating a semiconductor device of the first conventional example.
Figure 14B:
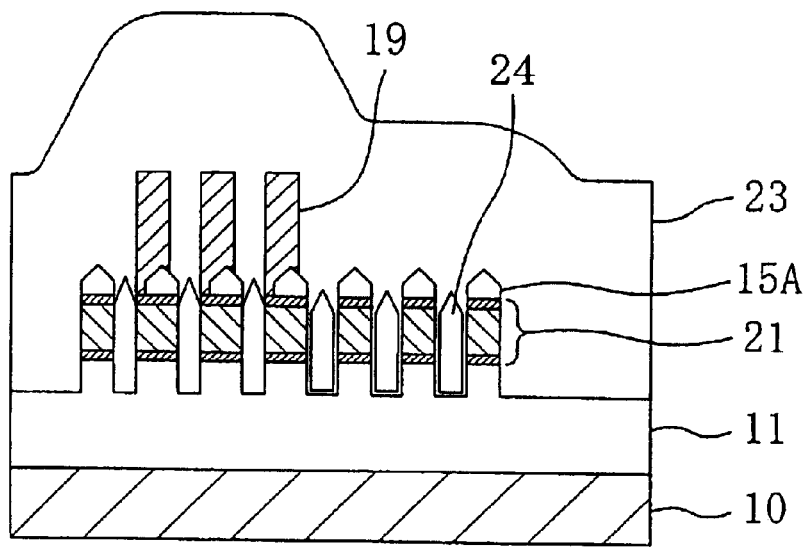
Figure 14C:
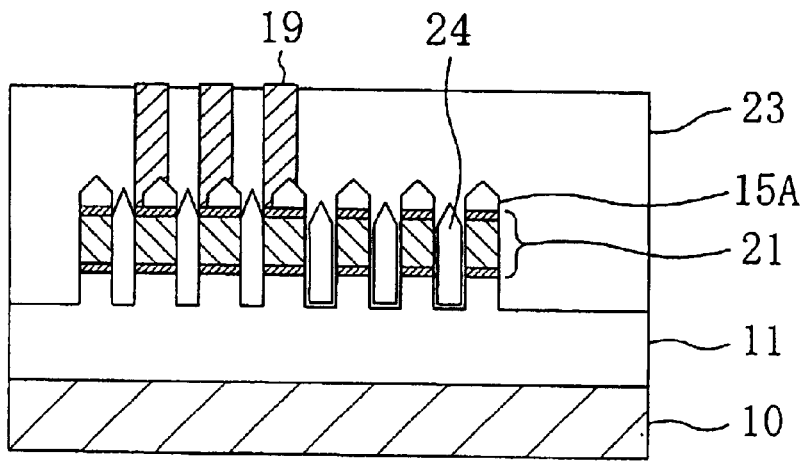
Figure 15A:
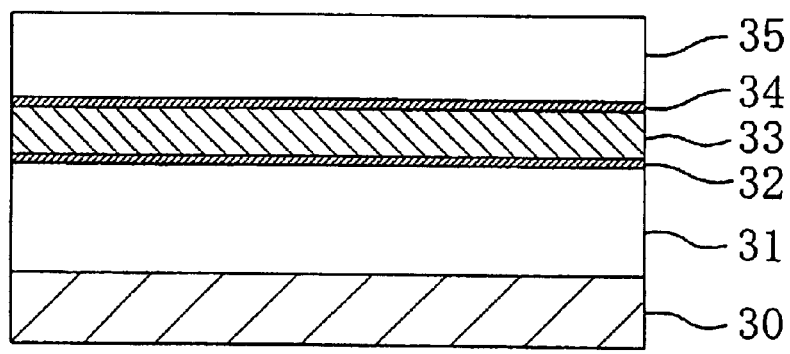
FIGS. 15A, 15B and 15C are cross-sectional views for showing procedures in a method for fabricating a semiconductor device according the second conventional example.
Figure 15B:
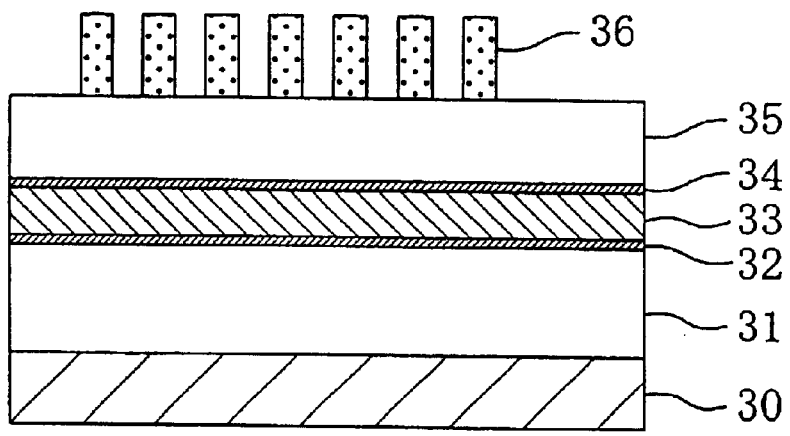
Figure 15C:
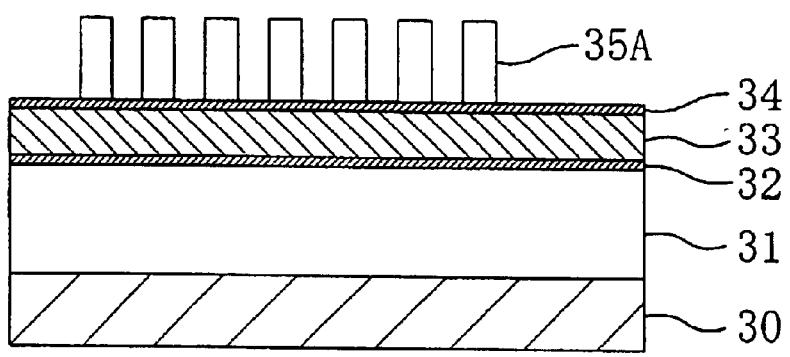
Figure 16A:
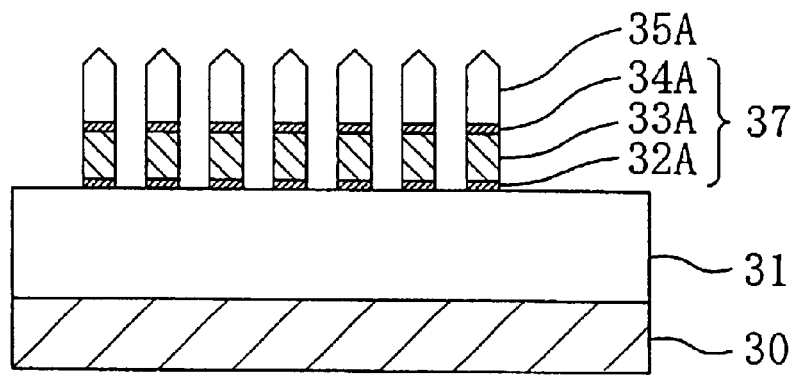
FIGS. 16A, 16B and 16C are cross-sectional views for showing other procedures in the method for fabricating a semiconductor device of the second conventional example.
Figure 16B:
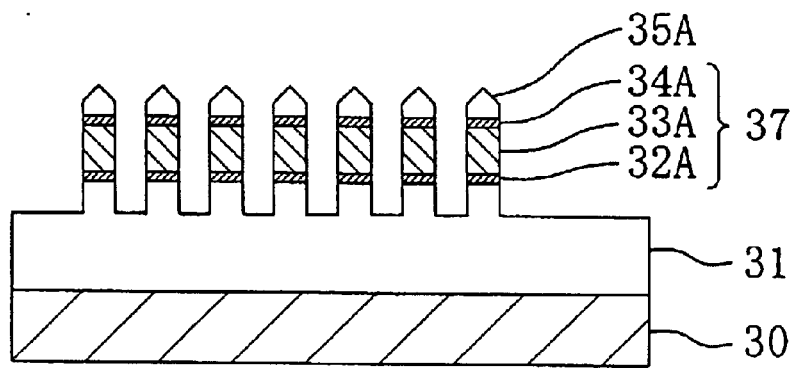
Figure 16C:
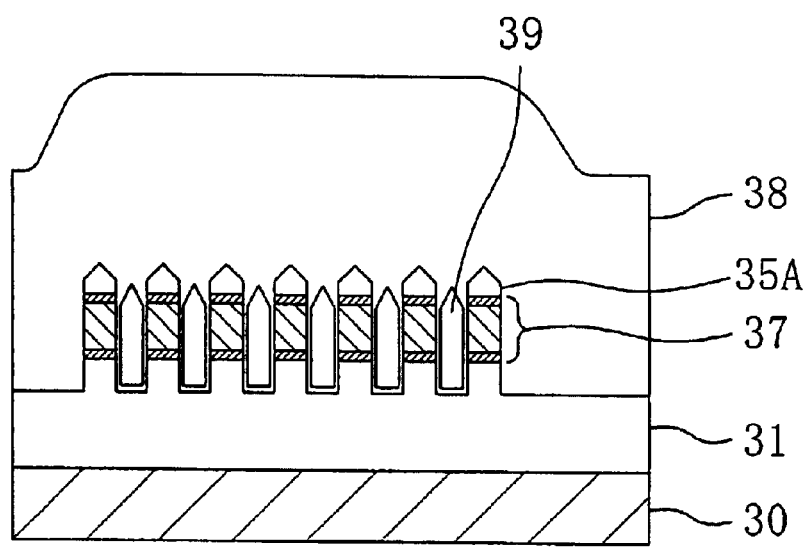
Figure 17A:
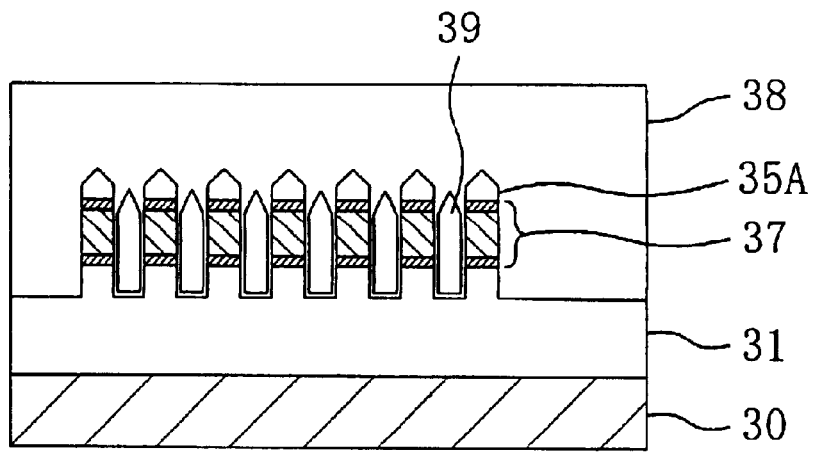
FIGS. 17A, 17B and 17C are cross-sectional views for showing still other procedures in the method for fabricating a semiconductor device of the second conventional example.
Figure 17B:
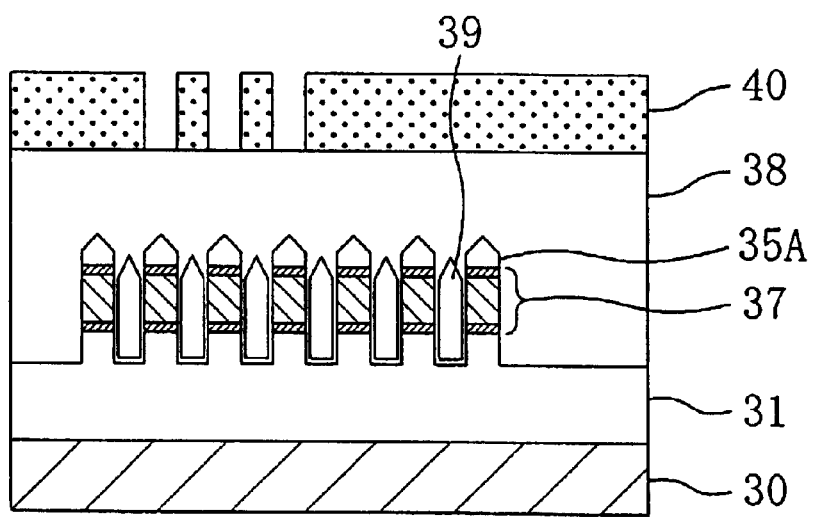
Figure 17C:
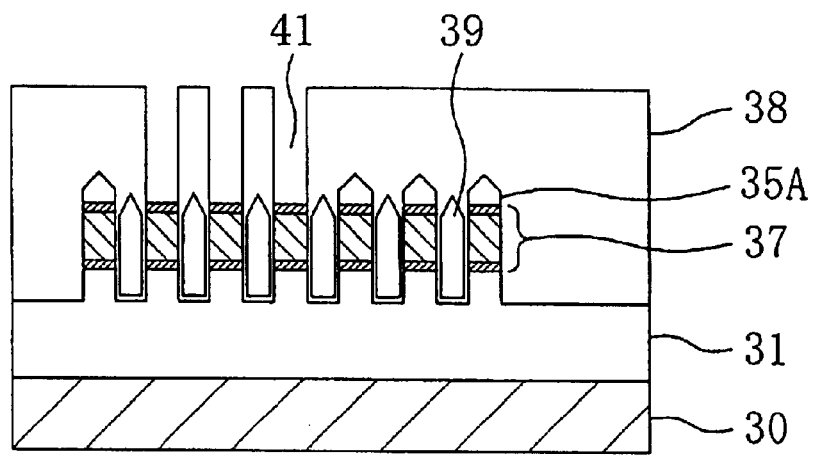
Figure 18A:
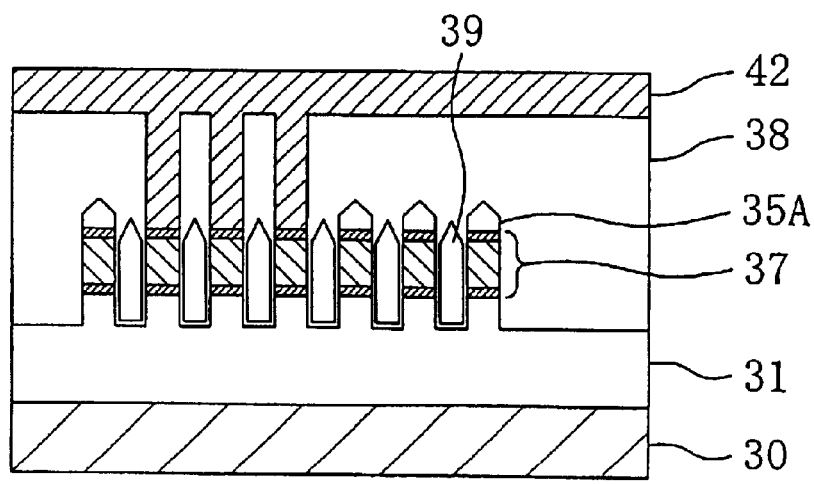
FIGS. 18A and 18B are cross-sectional views for showing still other procedures in the method for fabricating a semiconductor device of the second conventional example.
Figure 18B:
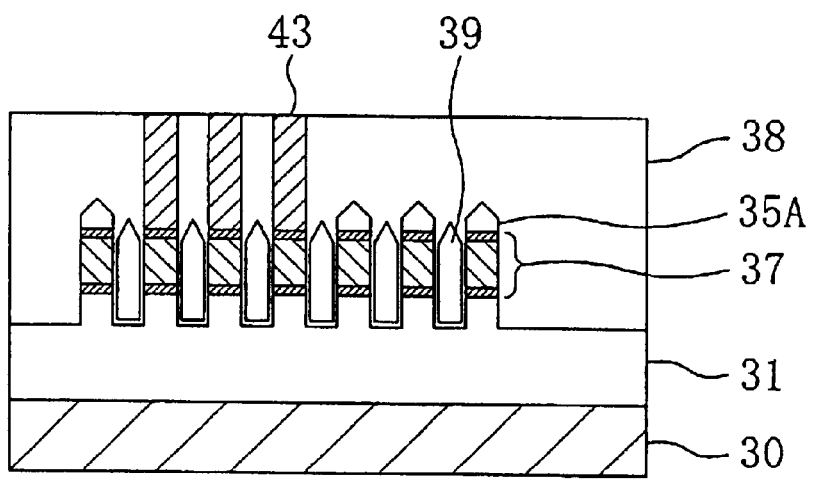

Then, as shown in FIG. 10C, an unnecessary portion of the second metal film 213 present on the upper interlayer insulating film 209 is removed by the CMP, so as to form contact plugs 214 from the second metal film. Thus, an interconnect structure having an air gap is completed. When the aforementioned sequence is repeated, a semiconductor device having a multi-layer interconnect structure can be fabricated.

Since the top portion of each air gap 210 is positioned at the level higher than the metal interconnects 208 in Embodiment 2, the volume of the air gap in a region between the upper ends of the metal interconnects 208 where an electric field is collected can be increased. Therefore, the capacitance between the interconnects can be sufficiently reduced, resulting in improving the performance and the reliability of the semiconductor device. (Insulating materials used for lower and upper interlayer insulating films and first, second and third insulating films)

Combinations of insulating materials used for the lower interlayer insulating film 101 (201), the upper interlayer insulating film 114 (209), the first insulating film 105 (205), the second insulating film 106 (206) of Embodiments 1 and 2 and the third insulating film 107 of Embodiment 1 will now be specifically described. The following description is applicable to both Embodiments 1 and 2 unless otherwise mentioned.

<First Combination>

In a first combination, the lower interlayer insulating film is made from an inorganic insulating material including an inorganic component as a principal constituent and including neither nitrogen nor carbon, or a hybrid insulating material including an organic component and an inorganic component; and the second insulating film is made from an inorganic insulating material including an inorganic component as a principal constituent and including nitrogen or carbon.

Examples of the lower interlayer insulating film are an inorganic insulating film such as a silicon oxide film or a silicon oxide fluorinated film, and a hybrid insulating film such as a silicon oxide film including a hydrogen atom or a hydrocarbon compound like a methyl group. In this case, the upper interlayer insulating film is also made from an inorganic insulating film such as a silicon oxide film or a silicon oxide fluorinated film, or a hybrid insulating film such as a silicon oxide film including a hydrogen atom or a hydrocarbon compound like a methyl group.

An example of the second insulating film is an inorganic insulating film including nitrogen or carbon, such as a silicon nitride film, a silicon oxide nitrided film, a silicon carbide film or a silicon oxide carbonated film.

When this combination is employed, the etching resistance of the second insulating film can be increased in the dry etching of the lower interlayer insulating film, and hence, the lower interlayer insulating film can easily attain an etching rate higher than that of the second insulating film.

Examples of the first insulating film are a silicon oxide film, a silicon oxide fluorinated film, a silicon oxide film including a hydrogen atom or a hydrocarbon compound like a methyl group, and what is called a low-k film including an organic component as a principal constituent.

Also, examples of the third insulating film of Embodiment 1 are a silicon oxide film, a silicon oxide fluorinated film, a silicon oxide film including a hydrogen atom or a hydrocarbon compound like a methyl group, and what is called a low-k film including an organic component as a principal constituent.

<Second Combination>

In a second combination, the lower interlayer insulating film is made from an organic insulating material including an organic component as a principal constituent; and the second insulating film is made from an inorganic insulating material including an inorganic component as a principal constituent or a hybrid insulating material including an organic component and an inorganic component.

An example of the lower interlayer insulating film is an organic film of an organic polymer such as an aromatic polymer. In this case, the upper interlayer insulating film may be made from an organic film, an inorganic film or a hybrid film. When the upper interlayer insulating film is made from an organic film, a multi-layer interconnect structure including a plurality of interconnect structures described in Embodiment 1 or 2 can be realized. When the upper interlayer insulating film is made from an inorganic film or a hybrid film, the film structure can be optimized in each layer divided by interlayer insulating films.

Examples of the second insulating film are an inorganic insulating film such as a silicon oxide film, a silicon oxide fluorinated film, a silicon nitride film, a silicon oxide nitrided film, a silicon carbide film or a silicon oxide carbonated film, and a hybrid insulating film such as a silicon oxide film including a hydrogen atom or a hydrocarbon compound like a methyl group.

When this combination is employed, the etching resistance of the second insulating film can be increased in the dry etching of the lower interlayer insulating film. Therefore, the lower interlayer insulating film can easily attain an etching rate higher than that of the second insulating film.

Furthermore, the interlayer insulating film can attain a lower dielectric constant than in the first combination, and hence, a higher performance multi-layer interconnect structure with low capacitance can be realized.

Examples of the first insulating film are a silicon oxide film, a silicon oxide fluorinated film, a silicon oxide film including a hydrogen atom or a hydrocarbon compound like a methyl group, what is called a low-k film including an organic component as a principal constituent, and what is called a porous film having fine pores.

Examples of the third insulating film of Embodiment 1 are a silicon oxide film, a silicon oxide fluorinated film, a silicon oxide film including a hydrogen atom or a hydrocarbon compound like a methyl group, what is called a low-k film including an organic component as a principal constituent, and what is called a porous film having fine pores.

<Third Combination>

In a third combination, the lower interlayer insulating film is made from an inorganic or organic porous insulating material; and the second insulating film is made from an inorganic insulating material including an inorganic component as a principal constituent, or a hybrid insulating material including an organic component and an inorganic component.

An example of the lower interlayer insulating film is an inorganic or organic porous film having fine pores.

Examples of the second insulating film are an inorganic insulating film such as a silicon oxide film, a silicon oxide fluorinated film, a silicon nitride film, a silicon oxide nitrided film, a silicon carbide film or a silicon oxide carbonated film, and a hybrid insulating film such as a silicon oxide film including a hydrogen atom or a hydrocarbon compound like a methyl group.

When this combination is employed, the etching resistance of the second insulating film can be increased in the dry etching of the lower interlayer insulating film. Therefore, the lower interlayer insulating film can easily attain an etching rate higher than that of the second insulating film.

Furthermore, the interlayer insulating film can attain a lower dielectric constant than in the first and second combinations, and hence, a much higher performance multi-layer interconnect structure with low capacitance can be realized.

Examples of the first insulating film are a silicon oxide film, a silicon oxide fluorinated film, a silicon oxide film including a hydrogen atom or a hydrocarbon compound like a methyl group, what is called a low-k film including an organic component as a principal constituent, and what is called a porous film having fine pores.

Examples of the third insulating film of Embodiment 1 are a silicon oxide film, a silicon oxide fluorinated film, a silicon oxide film including a hydrogen atom or a hydrocarbon compound like a methyl group, what is called a low-k film including an organic component as a principal constituent, and what is called a porous film having fine pores.

What is claimed is:

1. A method for fabricating a semiconductor device comprising the steps of:
   depositing a first metal film on a lower interlayer insulating film formed on a semiconductor substrate;
   forming a second insulating film made from a different material from said lower interlayer insulating film on said first metal film with a first insulating film sandwiched therebetween;
   forming a contact plug opening in said second insulating film and said first insulating film;
   forming a contact plug by filling said contact plug opening with a second metal film;
   forming a transfer pattern composed of a patterned second insulating film, a patterned first insulating film and said contact plug by etching said second insulating film and said first insulating film with a mask pattern formed on said second insulating film in an interconnect pattern used as a mask;
   forming metal interconnects from said first metal film by etching said first metal film with said transfer pattern used as a mask;
   trenching portions of said lower interlayer insulating film between said metal interconnects by etching said lower interlayer insulating film under conditions in which said lower interlayer insulating film has an etching rate higher than an etching rate of said second insulating film; and
   forming an upper interlayer insulating film on said lower interlayer insulating film, whereby covering said patterned second insulating film and forming an air gap between said metal interconnects.

2. The method for fabricating a semiconductor device of claim 1,
   wherein a top portion of said air gap is positioned at a level higher than said metal interconnects.

3. The method for fabricating a semiconductor device of claim 1,
   wherein said lower interlayer insulating film is made from an inorganic insulating material including an inorganic component as a principal constituent and including neither nitrogen nor carbon, or a hybrid insulating material including an organic component and an inorganic component, and
   said second insulating film is made from an inorganic insulating material including an inorganic material as a principal constituent and including nitrogen or carbon.

4. The method for fabricating a semiconductor device of claim 1,
   wherein said lower interlayer insulating film is made from an organic insulating material including an organic component as a principal constituent, and
   said second insulating film is made from an inorganic insulating material including an inorganic component as a principal constituent or a hybrid insulating material including an organic component and an inorganic component.

5. The method for fabricating a semiconductor device of claim 1,
   wherein said lower interlayer insulating film is made from an inorganic or organic porous insulating material, and
   said second insulating film is made from an inorganic insulating material including an inorganic component as a principal constituent or a hybrid insulating material including an organic component and an inorganic component.

6. A method for fabricating a semiconductor device comprising the steps of:
   depositing a first metal film on a lower interlayer insulating film formed on a semi conductor substrate;
   forming a second insulating film from a different material from said lower interlayer insulating film on said first metal film with a first insulating film sandwiched therebetween;
   forming a transfer pattern composed of a patterned second insulating film and a patterned first insulating-film by etching said second insulating film and said first insulating film with a mask pattern formed on said second insulating film in an interconnect pattern used as a mask;
   forming metal interconnects from said first metal film by etching said first metal film with said transfer pattern used as a mask;
   trenching portions of said lower interlayer insulating film between said metal interconnects by etching said lower interlayer insulating film under conditions in which said lower interlayer insulating film has an etching rate higher than an etching rate of said second insulating film; and
   forming an upper interlayer insulating film on said lower interlayer insulating film, whereby covering said patterned second insulating film and forming an air gap between said metal interconnects.

7. The method for fabricating a semiconductor device of claim 6,
   wherein a top portion of said air gap is positioned at a level higher than said metal interconnects.

8. The method for fabricating a semiconductor device of claim 6,
   wherein said lower interlayer insulating film is made from an inorganic insulating material including an inorganic component as a principal constituent and including neither nitrogen nor carbon, or a hybrid insulating material including an organic component and an inorganic component, and
   said second insulating film is made from an inorganic insulating material including an inorganic material as a principal constituent and including nitrogen or carbon.

9. The method for fabricating a semiconductor device of claim 6,
   wherein said lower interlayer insulating film is made from an organic insulating material including an organic component as a principal constituent, and
   said second insulating film is made from an inorganic insulating material including an inorganic component as a principal constituent or a hybrid insulating material including an organic component and an inorganic component.

10. The method for fabricating a semiconductor device of claim 6,
   wherein said lower interlayer insulating film is made from an inorganic or organic porous insulating material, and
   said second insulating film is made from an inorganic insulating material including an inorganic component as a principal constituent or a hybrid insulating material including an organic component and an inorganic component.

* * * * *